(12) United States Patent
Lou

(10) Patent No.: US 6,492,270 B1
(45) Date of Patent: Dec. 10, 2002

(54) METHOD FOR FORMING COPPER DUAL DAMASCENE

(75) Inventor: Chine-Gie Lou, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/809,832

(22) Filed: Mar. 19, 2001

(51) Int. Cl.[7] ............... H01L 21/4763; H01L 21/44
(52) U.S. Cl. ............... 438/687; 438/627; 438/638; 438/643; 438/678; 438/692
(58) Field of Search ............... 438/637–641, 438/678, 643, 653, 672, 627, 692, 691, 738, 740, 751

(56) References Cited

U.S. PATENT DOCUMENTS

| | | | |
|---|---|---|---|
| 5,783,485 A | * 7/1998 | Ong et al. | 438/637 |
| 5,891,513 A | 4/1999 | Dubin et al. | 427/98 |
| 5,969,422 A | 10/1999 | Ting et al. | 257/762 |
| 6,040,243 A | * 3/2000 | Li et al. | 438/687 |
| 6,121,141 A | 9/2000 | Woo et al. | 438/687 |
| 6,136,707 A | 10/2000 | Cohen | 438/687 |
| 6,218,293 B1 | * 4/2001 | Krauss et al. | 438/635 |
| 6,284,657 B1 | * 9/2001 | Chooi et al. | |

* cited by examiner

*Primary Examiner*—Ha Tran Nguyen
(74) *Attorney, Agent, or Firm*—George O. Saile; Stephen B. Ackerman

(57) ABSTRACT

A different method is provided for forming high aspect ratio damascene structures with an integrated approach of combining electroless plating with physical vapor deposition of copper. A dual damascene structure, having a trench opening and a via opening, is first formed over a metal line on a substrate. The inside walls of the dual structure is lined with a diffusion barrier layer. Then, nitride spacers are formed on the inside walls of both the trench opening and the via opening. The via opening is further lined with a displacement, or, seed, layer. This is followed by forming electroless copper in the via opening, and hence a copper plug. A barrier metal is now formed over both the copper plug and the inside walls of the trench opening. Copper is next deposited over the barrier metal inside the trench, and including over the copper metal plug, using physical vapor deposition (PVD). Any excess metal is subsequently removed by CMP, thus forming a copper dual damascene interconnect that is highly conformable for high aspect ratios, and also void-free and reliable.

33 Claims, 7 Drawing Sheets

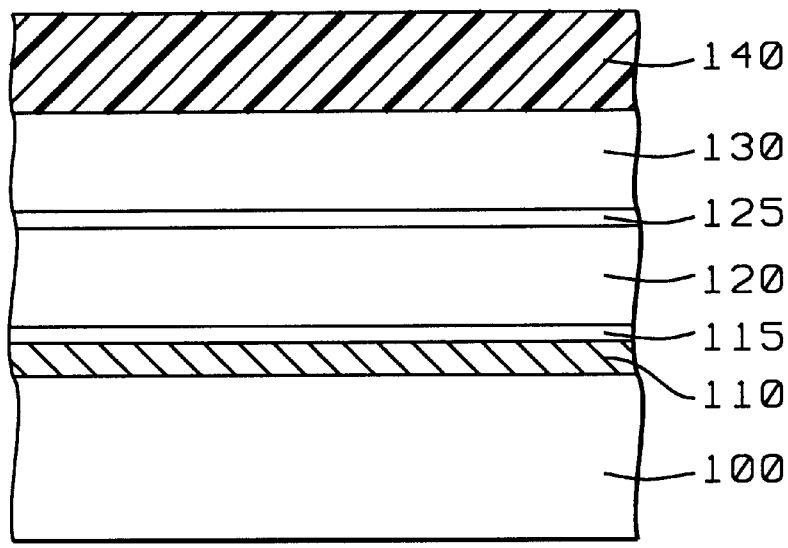
*FIG. 1a – Prior Art*
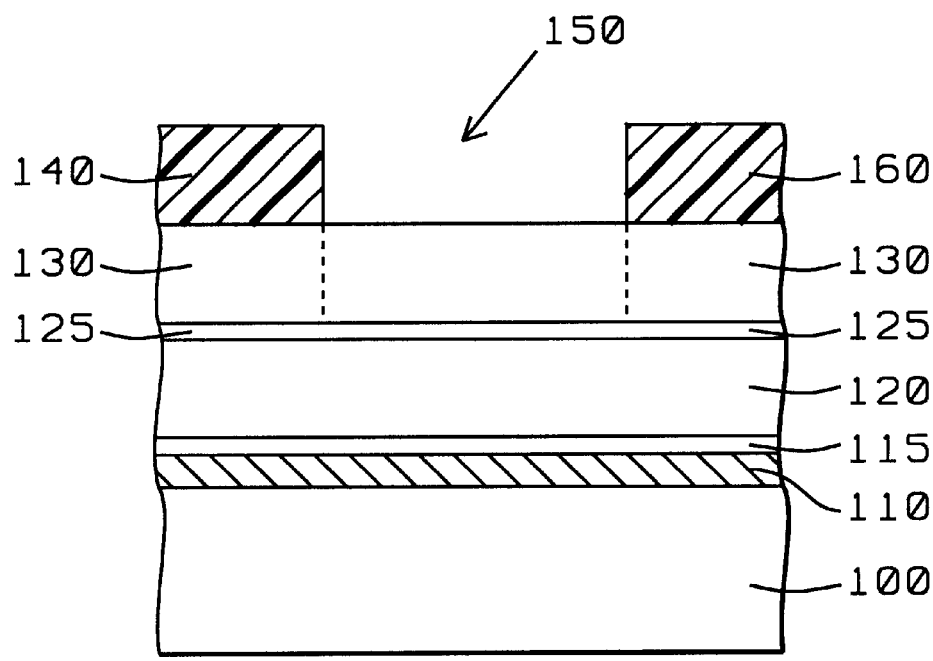
*FIG. 1b – Prior Art*

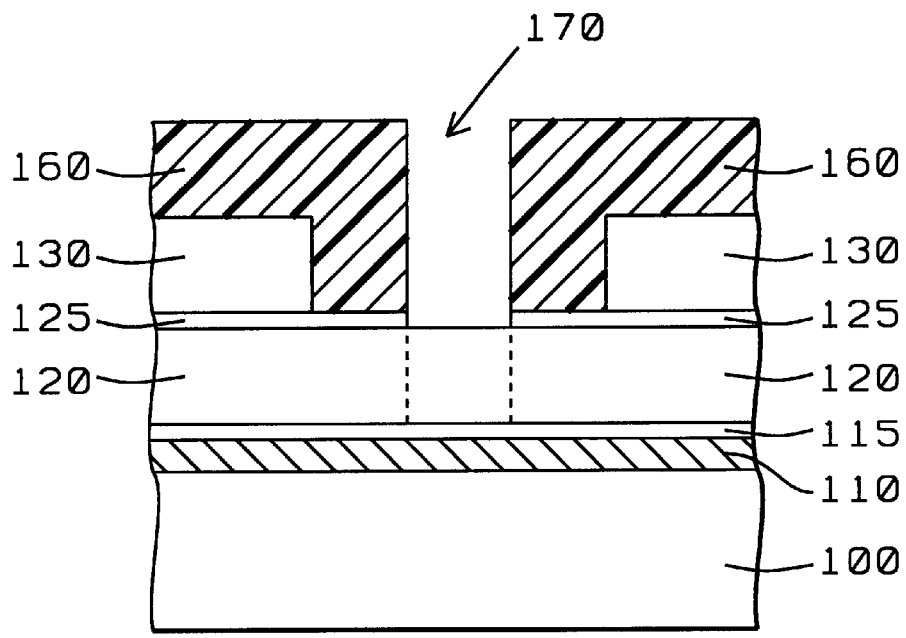
FIG. 1c – Prior Art
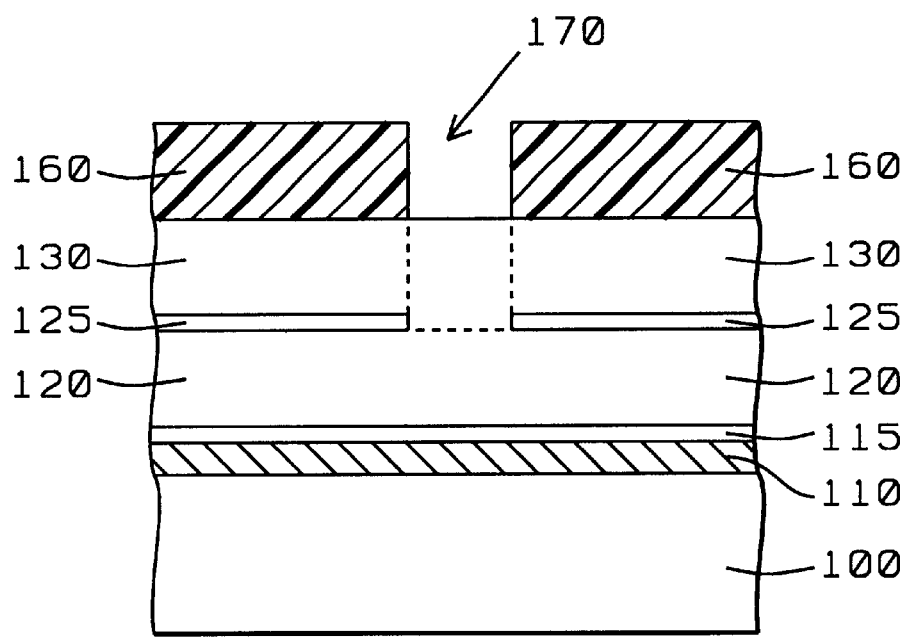
FIG. 1d – Prior Art

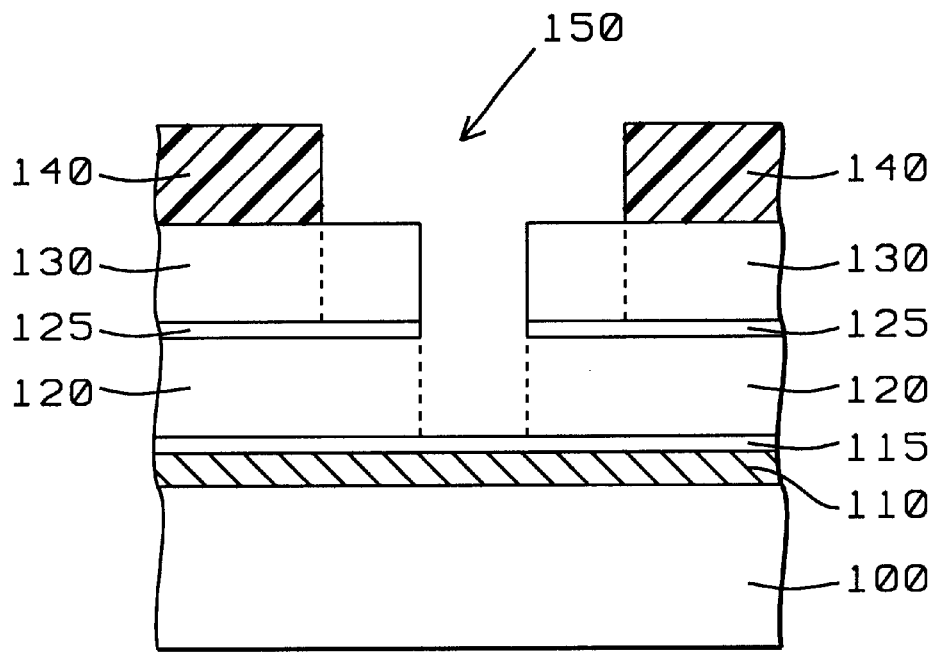
FIG. 1e – Prior Art
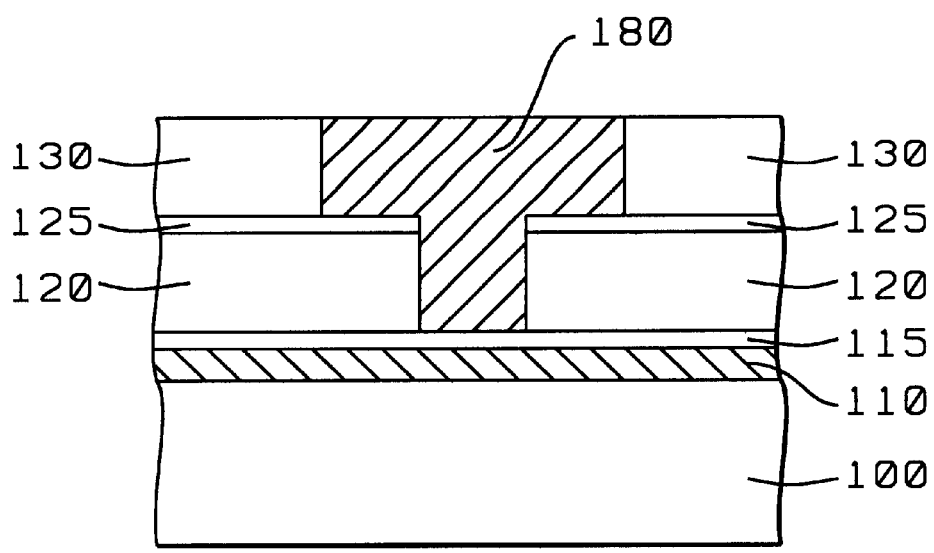
FIG. 1f – Prior Art

METHOD FOR FORMING COPPER DUAL DAMASCENE

BACKGROUND OF THE INVENTION (1) Field of the Invention

The present invention relates to the manufacture of semiconductor devices in general, and in particular, to a method of forming a copper damascene interconnect with an integrated process using a copper via plug.

(2) Description of the Related Art

Conventional techniques of fabricating a dual damascene structure usually starts with the forming of an intermetal dielectric (IMD) layer over a semiconductor substrate, followed by the etching of the IMD to define the via and trench openings that will hold the metal wiring. The vertically connected via/trench openings together form the dual damascene structure, as it will be described more in detail later. Prior to filling with copper as the filler metal, the via and trench openings are first lined with a barrier material in order to prevent copper diffusion into the surrounding IMD layer. The barrier material is further lined with a copper seed layer in order to improve the adhesion of the yet-to-be deposited bulk copper to the barrier material. Finally, the via/trench dual damascene structure is filled with copper by using electroplating techniques. Any excess copper metal over and above the surface of the dual damascene structure is removed by chemical mechanical polishing (CMP), as is well known in the art. However, what is being realized more and more in the semiconductor art is that the conventional methods of forming dual damascene structures such as briefly described above are becoming inadequate to satisfy the stringent topology requirements of the continuously shrinking feature sizes—in some cases as low as 0.10 micrometers ($\mu$m)—of the deep-submicron technologies of to-day. A case in point is the non-uniformity of a copper seed layer over a barrier layer in high aspect ratio openings, as it will be appreciated by those skilled in the art. It is disclosed later in the embodiments of the present invention a method of avoiding such non-uniform topologies in the forming of copper dual damascene structures.

Copper is a preferred metal for use as an interconnect in semiconductor devices. This is because, as is well known in the art, copper has lower resistivity than the commonly used aluminum and has better electromigration properties. At the same time, the advent of copper interconnects has motivated the use of insulating materials with low dielectric constant (k) in order to further improve the over-all device performance. Some of the low-k candidates are fluorinated materials, such as amorphous fluorinated carbon ($\alpha$-C:F), PTFE, fluorinated $SiO_2$ and fluorinated polyimide. However, defluoriniation occurs with these materials, which then reacts with barrier materials and causes delamination. Barrier materials are used because, copper unfortunately suffers from high diffusivity in these insulating materials. For instance, copper tends to diffuse into polyimide during high temperature processing of the polyimide. This causes severe corrosion of the copper and the polyimide due to the copper combining with oxygen in the polyimide. The corrosion may result in loss of adhesion, delamination, voids, and ultimately a catastrophic failure of the component. A copper diffusion barrier is therefore often required.

Copper dual damascene process is a well-known technique for forming interconnections in semiconductor devices. It is especially well suited for Ultra Large Scale Integrated (ULSI) circuit technology where more and more devices are being packed into the same or smaller areas in a semiconductor substrate. As the feature sizes get smaller, the smaller geometries result in higher electrical resistances, which in turn degrade circuit performance. As will be described more fully later, damascene process provides a more exact dimensional control over small geometries, while copper, as the metallization material, provides better electrical characteristics.

The term 'damascene' is derived from a form of inlaid metal jewelry first seen in the city of Damascus. In the context of integrated circuits it implies a patterned layer imbedded on and in another layer such that the top surfaces of the two layers are coplanar. Thus, in semiconductor manufacturing, grooves and holes in appropriate locations in the grooves are formed in an insulating material by etching, which are then filled with metal. Metal in grooves form the horizontal metal line interconnects while the metal in the underlying holes form the vertical connections to the layers of metal interconnects formed in the previous damascene structure.

Thus, in a single damascene semiconductor manufacturing process, incisions, or grooves, are formed in an insulating layer and filled with metal to form conductive lines. Dual damascene takes the process one step further in that, in addition to forming the grooves of a single damascene, hole openings are also formed at appropriate places in the groove further into the insulating layer. The resulting composite structure of grooves and holes are filled with metal. The process is repeated as many times as required to form the multi-level interconnections between metal lines and the holes formed therebetween.

In one approach for a dual damascene process shown in FIG. 1a, two insulating layers (120) and (130) are formed on a substrate (100) with an intervening etch-stop layer (125). Substrate (100) is provided with metal layer (110) and a barrier layer or passivation layer (115). Metal layer can be the commonly used aluminum or copper, while the barrier layer can be an oxide layer or nitride layer. A desired trench or groove pattern (150) is first etched into the upper insulating material (130) using conventional photolithographic methods and photoresist (140). The etching stops on etch-stop layer (125). Next, a second photoresist layer (160) is formed over the substrate, thus filling partially the groove opening (150), and patterned with hole opening (170), as shown in FIG. 1b. The hole pattern is then etched into the lower insulating layer (120) as shown in FIG. 1c and photoresist removed, thus forming the dual damascene structure shown in FIG. 1f.

Or, the order in which the groove and the hole are formed can be reversed. Thus, the upper insulating layer (130) is first etched, or patterned, with hole (170), as shown in FIG. 1d. The hole pattern is also formed into etch-stop layer (125). Then, the upper layer is etched to form groove (150) while at the same time the etching transfers the hole pattern in the etch-stop layer into lower insulation layer (120), as shown in FIG. 1e. It will be noted that the etch-stop layer stops the etching of the groove into the lower insulation layer.

After the completion of the thusly formed dual damascene structure, both the hole opening and groove opening are usually filled with metal (180), and any excess material on the surface of the substrate is removed by chemical mechanical polishing (CMP), as shown in FIG. 1f.

In prior art, both electroless and electroplating techniques have been used in forming interconnects on a semiconductor substrate. Thus, in U.S. Pat. No. 5,891,513, Dubin, et al., disclose a method where once a via or a trench is formed in a dielectric layer, a titanium nitride (TiN) or tantalum (Ta) barrier layer is blanket deposited. Then, a contact displacement technique is used to form a thin activation seed layer of copper on the barrier layer. An electroless deposition technique is then used to auto-catalytically deposit copper on the activated barrier layer. The electroless copper deposition continues until the via trench is filled. Subsequently, the surface is polished by an application of chemical-mechanical polishing (CMP) to remove excess copper and barrier material from the surface, so that the only copper and harrier material remaining are in the via/trench openings. Then an overlying silicon nitride (SiN) layer is formed above the exposed copper in order to form a dielectric harrier layer. The copper interconnect is fully encapsulated from the adjacent material by the TiN (or Ta) and the SiN layers.

In another U.S. Pat. No. 5,969,422, Ting shows an interconnect structure that is formed by electroplating or electroless plating of Cu or a Cu-base alloy on a seed layer comprising an alloy of a catalytically active metal, such as Cu, and a refractory metal, such as Ta. The seed layer also functions as a barrier/adhesion layer for the subsequently plated Cu or Cu-base alloy.

On the other hand, Cohen in U.S. Pat. No. 6,136,707 shows a method of making a metallic interconnect by (a) forming a patterned insulating layer on a substrate, the patterned insulating layer including at least one opening and a field surrounding the at least one opening; (b) depositing a barrier layer over the field and inside surfaces of the at least one opening; (c) depositing a first seed layer over the barrier layer using a first deposition technique; (d) depositing a second seed layer over the first seed layer using a second deposition technique, and (e) electroplating a metallic layer over the second seed layer.

Woo, et al., in U.S. Pat. No. 6,121,141, address the forming of void free Cu or Cu alloy interconnects through annealing at super-atmospheric pressure after metallization. Embodiments include filling a damascene opening in a dielectric layer with Cu or a Cu alloy and heat treating in a chamber at a pressure of about 2 atmospheres to about 750 atmospheres.

However, with the continuing shrinkage of feature sizes, it is becoming more and more difficult to reliably fill high aspect ratio, that is, relatively deep openings, by conventional methods. It is shown later in the embodiments of the present invention a method of judicious electroless plating of the via opening followed by physical vapor deposition of copper into the trench opening that provides the forming of highly conformable, void-free, reliable damascene interconnects.

SUMMARY OF THE INVENTION

It is therefore an object of this invention to provide a method of forming a dual damascene interconnect using an integrated approach especially suited for high aspect ratio of highly shrunk interconnects of ULSI technology.

It is another object of the present invention to provide a method of forming a dual damascene structure where a metal plug is first formed in the via opening followed by the forming of a metal line in the trench opening of a dual damascene structure.

It is yet another object of the present invention to judiciously integrate the electroless copper forming of a metal via plug with the physical vapor deposition of copper into the trench opening of a dual damascene structure.

These objects are accomplished by providing a substrate; forming a first metal line on said substrate; forming an anti-reflective coating (ARC) layer over said first metal line; forming a liner layer over said substrate, including over said ARC layer over said first metal layer; forming a first dielectric layer over said liner layer; forming a first stop layer over said first dielectric layer; forming a second dielectric layer over said first stop layer; forming a second stop layer over said second dielectric layer; forming a dual damascene structure having a trench opening and a via opening in said second and first dielectric layers, respectively, over said first metal line; forming a thin spacer over the inside walls of said dual damascene structure; forming seed displacement layer over said thin spacer in said via portion of said dual damascene; forming a second metal in said via portion to form a metal plug; forming a barrier layer over said metal plug including the inside walls of said trench portion of said dual damascene; depositing a third metal over said substrate, including over said trench portion of said dual damascene structure; and removing any excess third metal over said dual damascene structure.

BRIEF DESCRIPTION OF THE DRAWINGS

FIGS. 1a–1c show the forming of a dual damascene structure where a line trench is etched first into an upper second dielectric layer until an etch-stop layer is reached, and then the via hole pattern etched into the lower first dielectric layer, according to prior art.

FIGS. 1d–1e show the forming of a dual damascene structure where a via hole pattern is etched first into an upper second dielectric layer until an etch-stop layer is reached, and then the line pattern etched into the top layer while at the same time the hole pattern is transferred into the lower first dielectric layer, according to prior art.

FIG. 1f shows a dual damascene structure formed by either one of the methods shown in FIGS. 1a–1c or FIGS. 1d–1e according to prior art.

DESCRIPTION OF THE PREFERRED EMBODIMENTS

Referring now the drawings, FIGS. 2a–2i, there is shown a method of forming high aspect ratio damascene structures with an integrated approach of combining electroless plating with physical vapor deposition of copper.

Figure 2A:
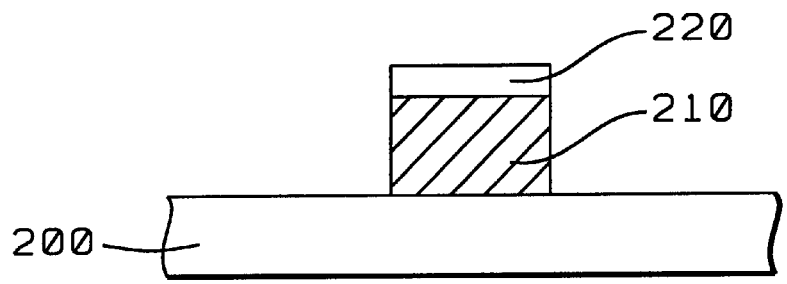
FIG. 2a is a partial cross-sectional view of a substrate having a metal line, with an optional ARC layer, formed thereon, according to the present invention.

Specifically, FIG. 2a shows a portion of a semiconductor substrate (200), preferably silicon, provided with a metal line (210) formed thereon. The metal line is preferably aluminum copper, and is optionally capped with an anti-reflective coating (ARC), referenced with numeral (220) in the same FIG. 2a. As is known in the art, usually a thin layer of titanium (Ti), or, preferably, titanium nitride (TiN) of a thickness between about 50 to 500 Å, is used as an ARC on films of aluminum in order to reduce line width variations over steps. Steps form over underlying lines that are covered with an insulating dielectric layer. The problem of steep steps, and hence the problem of line width variations over steps is exacerbated by the ever shrinking feature sizes of ULSI technology. It is disclosed below in the embodiments of the present invention a method of forming a dual damascene line over the existing line where the problem of line variation is circumvented. Furthermore, the method provides a method of connecting metal lines via metal plugs that are void-free.

Figure 2B:
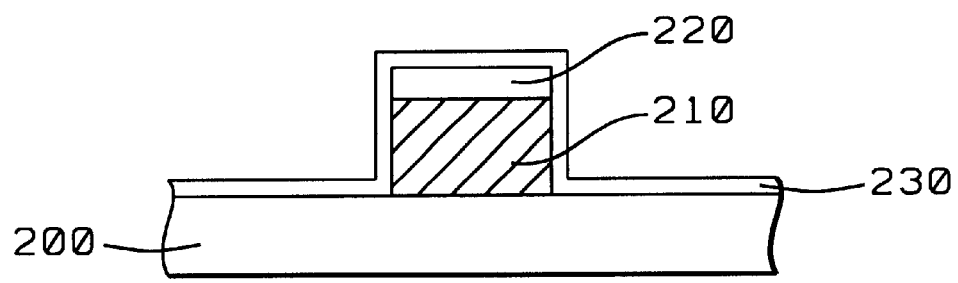
FIG. 2b is a partial cross-sectional view of a substrate showing the forming of a layer of liner over the substrate, including over the metal line of FIG. 2a, according to the present invention.

Substrate (200), including first metal line (210), is next covered with a layer of liner (230) as shown in FIG. 2b. It is preferred that the liner layer is aluminum nitride (AlN) having a thickness between about 300 to 1000 Å. The liner serves as a barrier to the diffusion of copper from the metal line into the surrounding dielectric layer that is to be formed next.

Figure 2C:
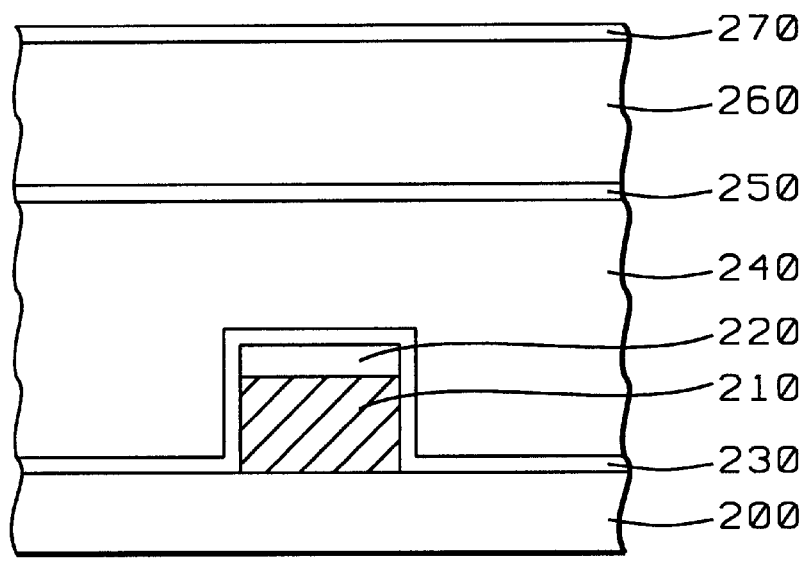
FIG. 2c is a partial cross-sectional view of a substrate showing the forming of first and second dielectric layers with an intervening etch-stop as well as a top etch-stop layer, over the substrate of FIG. 2b, according to the present invention.

The surrounding first dielectric layer, namely, layer (240) is blanket formed over the substrate as shown in FIG. 2c. Forming dielectric layers are known in the art. Blanket dielectric layers may be formed from materials including but not limited to silicon oxide materials, silicon nitride materials, and silicon oxynitrides materials formed within integrated circuits through methods including but not limited do chemical vapor deposition (CVD), plasma enhanced CVD (PECVD), or, physical vapor deposition (PVD) sputtering methods. For the preferred embodiment of the present invention, the blanket first dielectric layer (240) is preferably formed of a material of low dielectric constant (low-k), including but not restricted to amorphous fluorocarbon (α-C:F), poly-tetra-fluoro-ethylene (PTFE), Teflon, Parylene-F, fluorinated polyimide, fluorinated $SiO_2$ (FSG), and polymers. First dielectric layer (240) is formed to a thickness between about 2000 to 6000 Å by vapor deposition or spin coating followed by an optional furnace or rapid thermal annealing (RTA) treatment.

Next, an optional first etch-stop layer (250) shown in FIG. 2c is formed over the first dielectric layer. The etch-stop layer comprises silicon nitride (SiN) and is formed by vapor deposition to a thickness between about 200 to 1000 Å. This is followed by the forming of second dielectric layer (260), which is also a low-k material. It includes, but not limited to amorphous fluorocarbon, poly-tetra-fluoroethlylene (PTFE), Teflon, Parylene-F, fluorinated polyimide, fluorinated $SiO_2$ deposited by vapor deposition or spin coating to a thickness between about 2000 to 8000 Å. A second etch-stop layer, (270) is also formed over the second dielectric layer to a thickness between about 300 to 1500 Å, and comprising silicon nitride, same as the first etch-stop layer. It will be apparent to those skilled in the art that the first etch-stop layer is optional in that, in forming the dual damascene structure of the next step, conventional timed etch may be used instead of stopping the etching of the trench opening on layer (250).

Figure 2D:
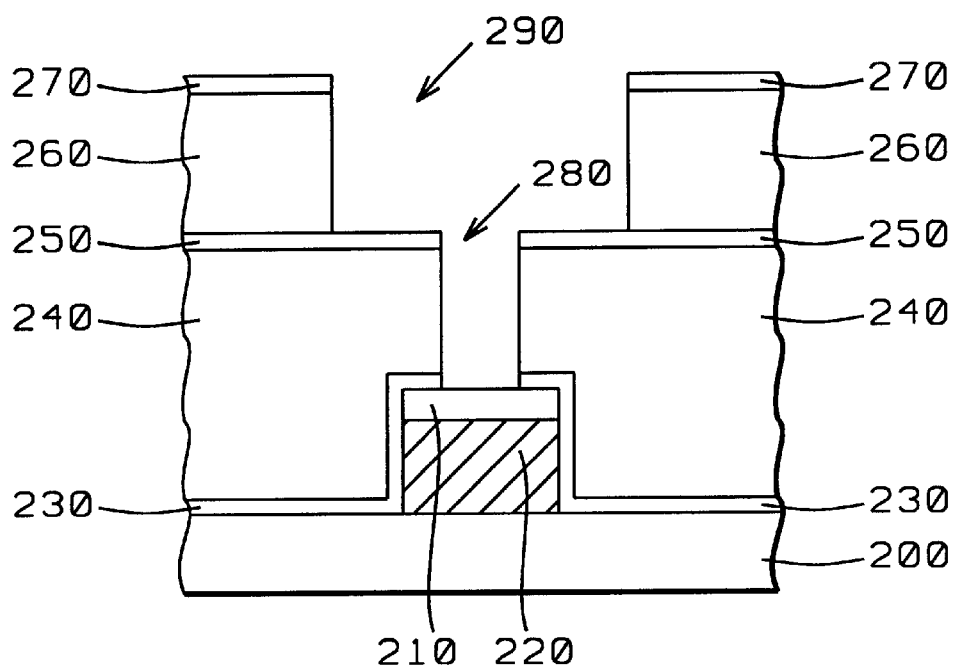
FIG. 2d is a partial cross-sectional view of a substrate showing the forming of a dual damascene structure having a via opening and a trench opening within the dielectric layers of FIG. 2c, according to the present invention.
Figure 2E:
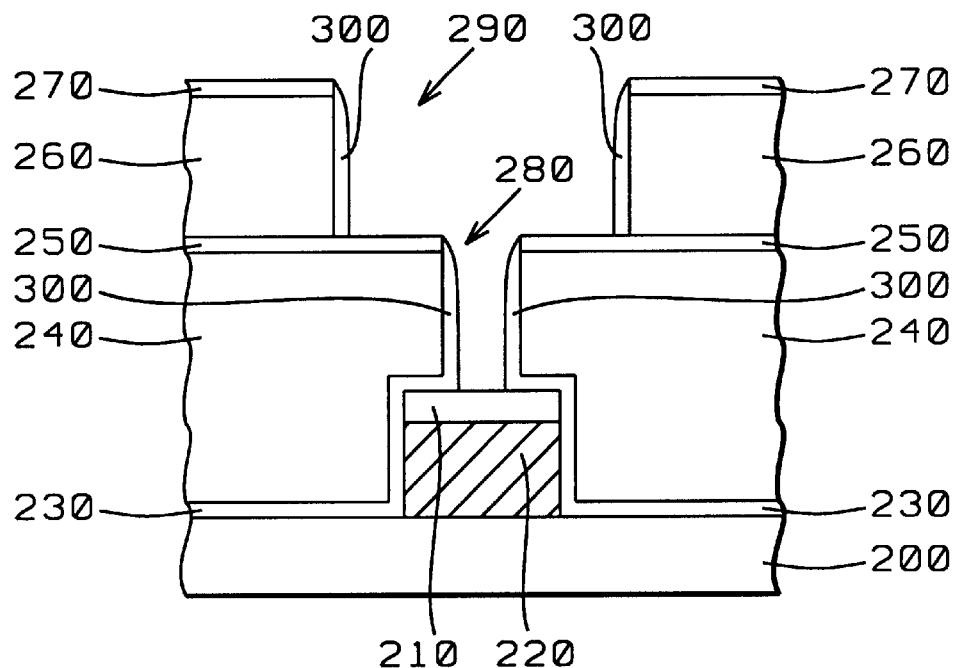
FIG. 2e is a partial cross-sectional view of a substrate showing the forming of nitride spacers on the vertical walls of the dual damascene structure of FIG. 2d, according to the present invention.

The dual damascene structure shown in FIG. 2d is formed by either etching via opening (280) first, and then trench opening (290), or in reverse order, as described earlier in FIGS. 1a–1f. Then, AlN layer (230) at the bottom of via opening (280) is etched to expose the top of metal line (210), as shown in FIG. 2d. This is followed by forming spacers (300) on the vertical walls of the via and trench openings by depositing a thin layer of SiN ($Si_3N_4$) and then etching, as is known in the art and shown in FIG. 2e. It is preferred that the thickness of the spacers is between about 150 to 500 Å.

Next, as a main feature and key aspect of the present invention, via opening (280) is filled with a second metal to form a metal plug. It will be known to those in the art that conventionally, in a damascene structure, both trench and via openings are filled with metal in one step, usually by electroplating copper. However, as the aspect ratio of the openings gets higher with ever shrinking dimensions, the filling of the same with such single step electroplating process gets more difficult, with the resultant voids in the metal. Thus, it is disclosed here that only the via opening is first filled with electroless copper, to form a copper via plug. In addition to being more cost effective than other copper deposition techniques, electroless copper also yields high quality copper. However, electroless deposition requires the activation of a surface in order to electrolessly deposit the copper. The present invention uses copper to activate the silicon nitride (SiN) spacer, reference numeral (300) in FIG. 2f, by the method of contact displacement. The contact displacement occurs wherever SiN layer (300) is subjected to an activation agent to initiate an autocatalytic reaction of the copper. The use of palladium (Pd) is one known technique for treating the surface to initiate the autocatalytic reaction of copper. However, the presence of Pd reduces the stability of electroless copper deposition and the formation of CuPd alloy increases the resistivity of electroless Cu deposits.

In order to affect the contact displacement of electrolessly deposited copper atoms to attach themselves to spacer SiN (300), the substrate—incorporating the spacer lined trench and via openings—is exposed, through immersion or other means, to a contact displacement deposition solution. The aqueous contact displacement solution can be formed having deionized (DI) water as the main component of the solution, and copper sulfate ($CuSO_4$) and hydrofluoric acid (HF) as the secondary and tertiary components. In this embodiment, it is preferred that the solution comprises $CuSO_4$, HF, potassium hydroxide, glyoxylic acid and that it is applied at a temperature between about 20 to 100° C. for a period of between about 1 to 100 minutes. After the activation process, the substrate is rinsed in DI water to remove the activation solution.

Figure 2F:
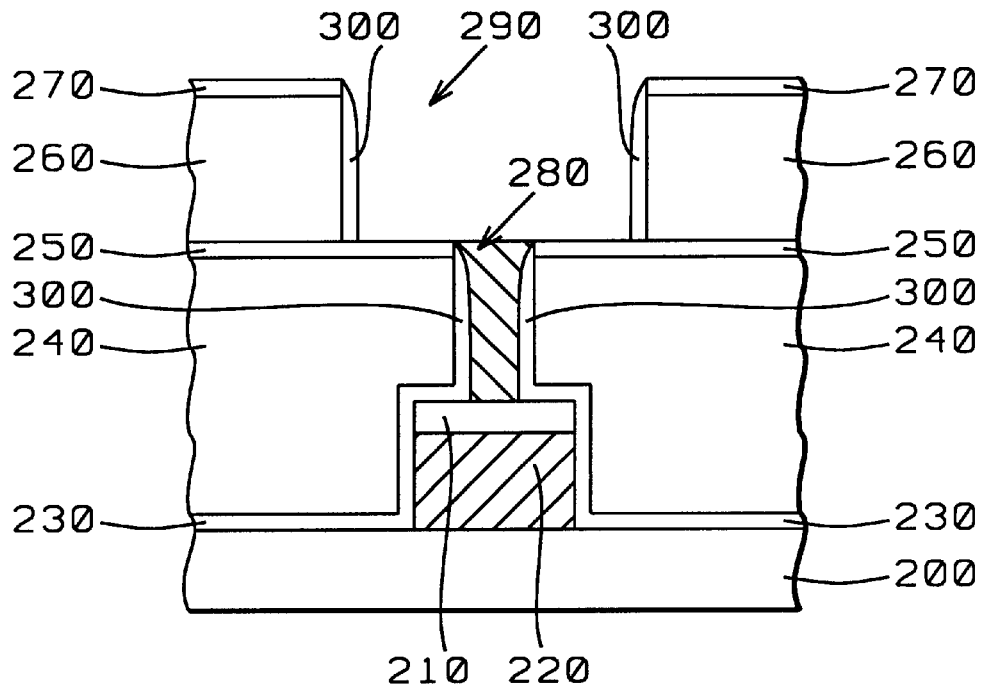
FIG. 2f is a partial cross-sectional view of a substrate showing the forming of an electroless metal plug in the via opening of the dual damascene structure of FIG. 2e, according to the present invention.

Subsequently, as shown in FIG. 2f, copper is deposited into via opening (280) by the technique of electroless copper deposition to form metal copper plug (310). The electroless deposition of copper occurs at those locations where copper atoms have activated the SiN spacer surfaces (300) in via opening (280). It is to be noted that a key aspect of the present invention is the use of silicon nitride as the activated surface, in contrast to other materials such as titanium, tantalum and tungsten nitrides.

Figure 2G:
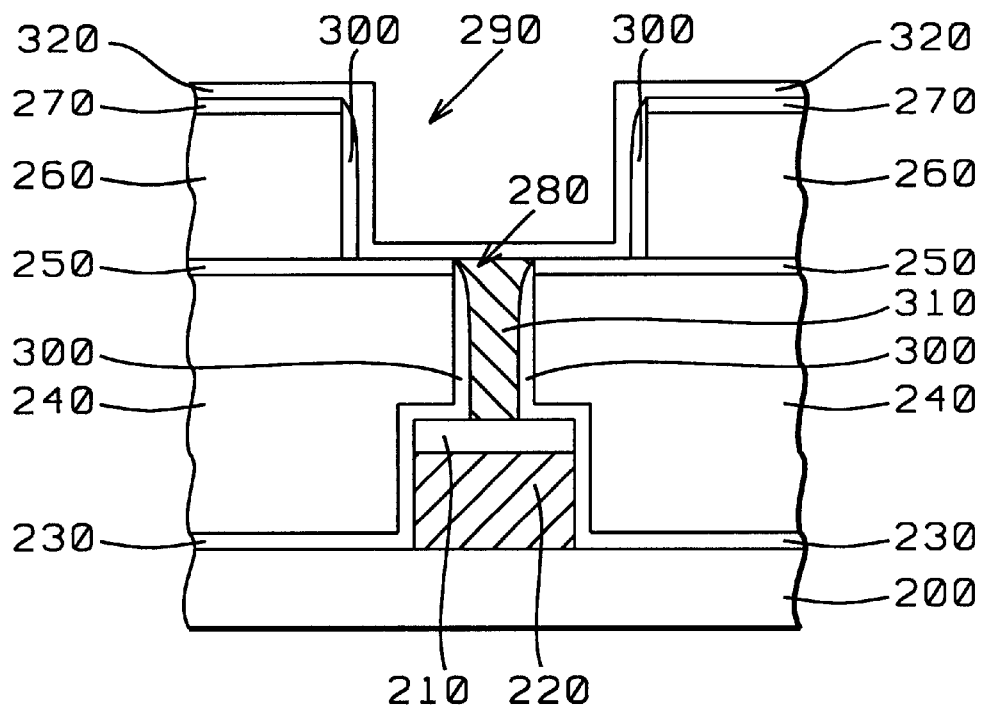
FIG. 2g is a partial cross-sectional view of a substrate showing the forming of a barrier layer on the inside walls the trench opening, along with over the metal plug of FIG. 2h, according to the present invention.

Subsequently, and optionally, barrier layer (320) is formed over the substrate, including the inside walls of trench opening (290) along with the top surface of copper plug (310) as shown in FIG. 2g. It is preferred that the barrier layer comprises titanium nitride (TiN), or tantalum nitride (TaN), and has a thickness between about 100 to 1500 Å. Barrier layer (320) provides barrier to diffusion of copper into surrounding dielectric layer (260), especially in thinner areas of the underlying spacer layer (300), when deposited at the next step.

Figure 2H:
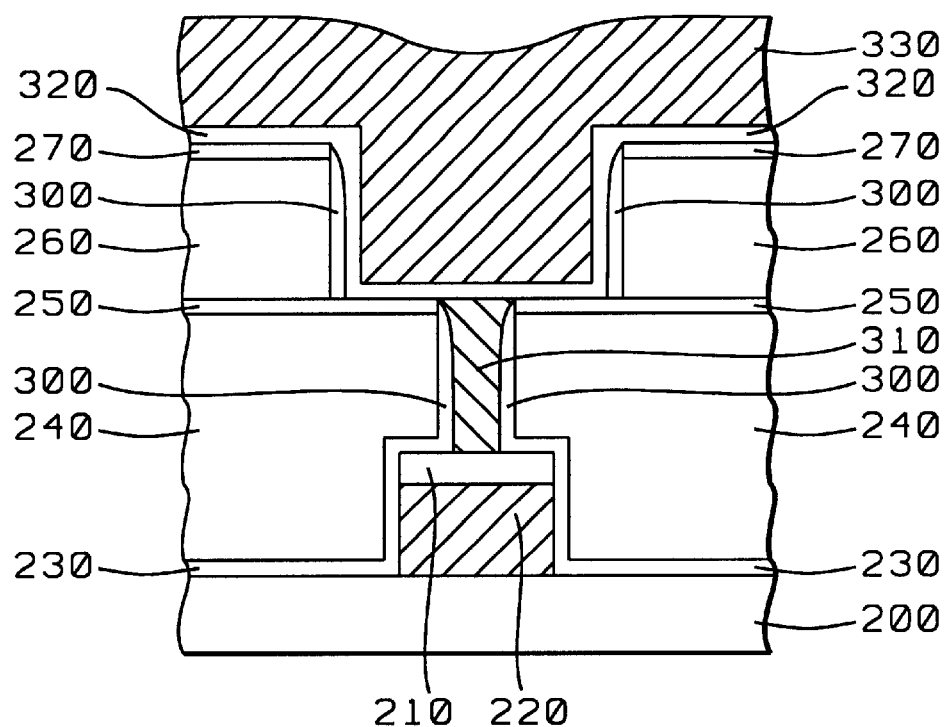
FIG. 2h is a partial cross-sectional view of a substrate showing the physical vapor deposition of copper over the substrate, including the trench of FIG. 2g according to the present invention.
Figure 2I:
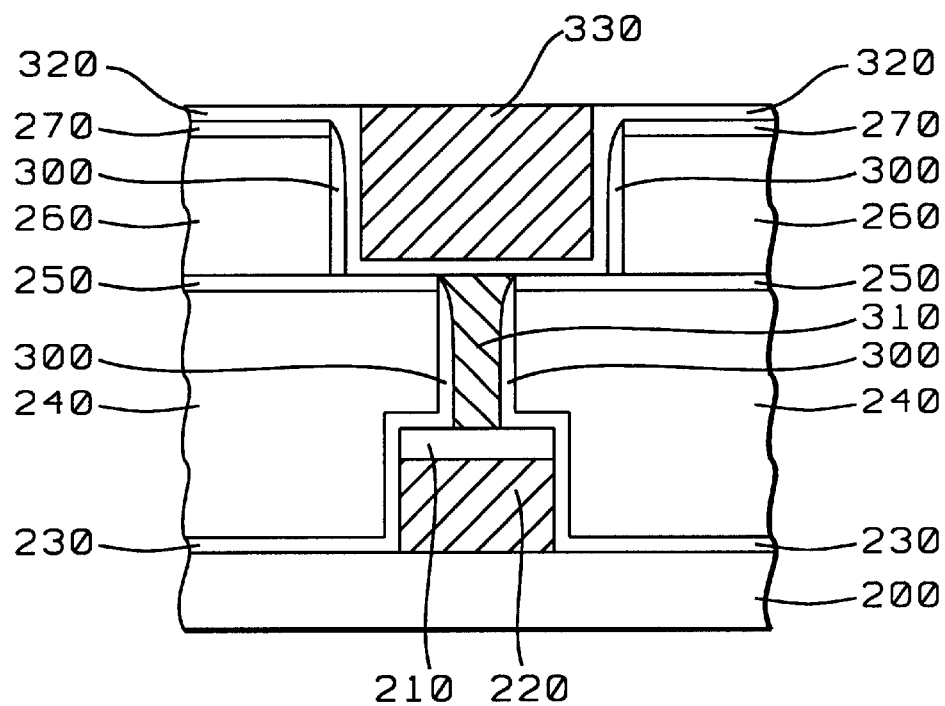
FIG. 2i is a partial cross-sectional view of a substrate showing the completion of the dual damascene structure of the present invention after chemical mechanical polishing (CMP) of the excess metal shown in FIG. 2h.

As another key aspect of the present invention, the electroless forming of copper plug in the via of the disclosed dual damascene structure is integrated with the next step of forming a third metal, namely, copper in the trench opening. That is, copper is formed in the trench using physical vapor deposition (PVD) sputtering methods, which is more suitable than electroplating relatively high aspect ratio openings. It is preferred that the thickness of PVD copper (330) shown in FIG. 2h is between about 3000 to 8000 Å. Any excess metal on the substrate, including over the trench is then removed using chemical mechanical polishing (CMP) techniques, thus completing the forming of the dual damascene interconnect of the instant invention as shown in FIG. 2i.

Though these numerous details of the disclosed embodiments are set forth here, such as process parameters, to provide an understanding of the present invention, it will be obvious, however, to those skilled in the art that these specific details need not be employed to practice the present invention. At the same time, it will be evident that the same methods may be employed in other similar process steps that are too many to cite, such as, for example, applying the same approach to the forming of not only dual or multi-damascene structures, but to single damascene structures as well. Furthermore, the dual damascene structure which is constructed here with the "via-first" approach can also be constructed using the "trench-first" approach, or other known approaches as it will be understood by those skilled in the art.

That is, while the invention has been particularly shown and described with reference to the preferred embodiments thereof, it will be understood by those skilled in the art that various changes in form and details may be made without departing from the spirit and scope of the invention.

What is claimed is:

1. A method of forming a dual damascene comprising the steps of:
   providing a substrate having a first metal line formed thereon;
   forming a dual damascene structure having a trench portion and a via portion over said metal line;
   forming a thin spacer over the vertical walls of said dual damascene structure;
   forming seed displacement layer over said thin spacer in said via portion of said dual damascene structures, wherein said forming said seed displacement layer is accomplished by using contact displacement solution comprising $CuSO_4$, HF, potassium hydroxide and glyoxylic acid;
   depositing a second metal in said via portion to form a metal plug structure, wherein the second metal comprises electroless copper;
   forming a barrier layer over said metal plug including the inside walls of said trench portion of said dual damascene structure;
   depositing a third metal over said substrate, including over said trench portion of said dual damascene structure, wherein the third metal comprises physical vapor deposited copper and fills up the trench portion; and
   removing any excess third metal over said dual damascene structure.

2. The method of claim 1, wherein said substrate is silicon.

3. The method of claim 1, wherein said first metal line comprises aluminum-copper.

4. The method of claim 1, wherein said thin spacer comprises silicon nitride.

5. The method of claim 1, wherein said thin spacer has a thickness between about 150 to 500 Å.

6. The method of claim 1, wherein said second metal in said via portion has a thickness between about 2000 to 6000 Å.

7. The method of claim 1, wherein said barrier layer comprises TiN, or, TaN.

8. The method of claim 1, wherein said barrier layer has a thickness between about 100 to 1500 Å.

9. The method of claim 1, wherein said third metal has a thickness between about 3000 to 8000 Å.

10. The method of claim 1, wherein said removing said excess third metal is accomplished by using chemical mechanical polishing (CMP).

11. A method of forming a dual damascene comprising the steps of:
    providing a substrate;
    forming a first metal line on said substrate;
    forming an anti-reflective coating (ARC) layer over said first metal line;
    forming a liner layer over said substrate, including over said ARC layer over said first metal layer;
    forming a first dielectric layer over said liner layer;
    forming a first stop layer over said first dielectric layer;
    forming a second dielectric layer over said first stop layer;
    forming a second stop layer over said second dielectric layer;
    forming a dual damascene structure hating a trench opening and a via opening in said second and first dielectric layers, respectively, over said first metal line;
    forming a thin spacer over the vertical walls of said dual damascene structure;
    forming seed displacement layer over said thin spacer in said via portion of said dual damascene structure, wherein said forming said seed displacement layer is accomplished by using contact displacement solution comprising $CuSO_4$, HF, potassium hydroxide and glyoxylic acid;
    depositing a second metal in said via portion to form a metal plug structure, wherein the second metal comprises electroless copper;
    forming a barrier layer over said metal plug including the inside walls of said trench portion of said dual damascene structure;
    depositing a third metal over said substrate, including over said trench portion of said dual damascene structure, wherein the third metal comprises physical vapor deposited copper word fills up the trench portion; and removing any excess third metal over said dual damascene structure.

12. The method of claim 11, wherein said substrate is silicon.

13. The method of claim 11, wherein said first metal line comprises aluminum-copper.

14. The method of claim 11, wherein said ARC comprises titanium-nitride (TiN).

15. The method of claim 11, wherein said ARC has a thickness between about 50 to 500 Å.

16. The method of claim 11, wherein said liner layer comprises aluminum nitride (AlN).

17. The method of claim 11, wherein said liner layer has a thickness between about 300 to 1000 Å.

18. The method of claim 11, wherein said first dielectric layer comprises FSG, polymer, or, polyimide.

19. The method of claim 11, wherein said first dielectric layer has a thickness between about 2000 to 6000 Å.

20. The method of claim 11, wherein said first stop layer comprises silicon nitride (SiN).

21. The method of claim 11, wherein said first stop layer has a thickness between about 200 to 1000 Å.

22. The method of claim 11, wherein said second dielectric layer comprises FSG, polymer, or, polyimide.

23. The method of claim 11, wherein said second dielectric layer has a thickness between about 2000 to 8000 Å.

24. The method of claim 11, wherein said second stop layer comprises SiN.

25. The method of claim 11, wherein said second stop layer has a thickness between about 300 to 1500 Å.

26. The method of claim 11, wherein said thin spacer comprises silicon nitride.

27. The method of claim 11, wherein said thin spacer has a thickness between about 150 to 500 Å.

28. The method of claim 11, wherein said forming said second metal in said via portion is accomplished by electroless plating.

29. The method of claim 11, wherein said second metal in said via portion has a thickness between about 2000 to 6000 Å.

30. The method of claim 11, wherein said barrier layer comprises TiN or TaN.

31. The method of claim 11, wherein said barrier layer has a thickness between about 100 to 1500 Å.

32. The method of claim 11, wherein said third metal has a thickness between about 3000 to 8000 Å.

33. The method of claim 11, wherein said removing said excess third metal is accomplished by using chemical mechanical polishing (CMP).

* * * * *